United States Patent [19]

Moll

[11] Patent Number: 5,600,316
[45] Date of Patent: Feb. 4, 1997

[54] DATA COMPRESSION BY REMOVING REPETITION AND UNNECESSARY INFORMATION

[76] Inventor: Edward W. Moll, 7 W. Bluebell La., Mount Laurel, N.J. 08054

[21] Appl. No.: 404,703

[22] Filed: Mar. 15, 1995

Related U.S. Application Data

[63] Continuation of Ser. No. 127,013, Sep. 24, 1993, Pat. No. 5,434,568, which is a continuation of Ser. No. 531,631, Jun. 1, 1990, abandoned, which is a continuation of Ser. No. 690,478, Jan. 10, 1985, abandoned.

[51] Int. Cl.$^6$ ........................................ H03M 7/30
[52] U.S. Cl. ........................................ 341/87
[58] Field of Search ........................ 341/67, 59, 51, 341/95

[56] References Cited

U.S. PATENT DOCUMENTS

| | | | |
|---|---|---|---|
| 4,232,375 | 11/1980 | Paugstat et al. | 364/900 |
| 4,280,192 | 7/1981 | Moll | 364/900 |
| 4,446,516 | 5/1984 | Nishimura | 364/200 |

*Primary Examiner*—Brian K. Young
*Attorney, Agent, or Firm*—Caesar, Rivise, Bernstein, Cohen & Pokotilow, Ltd.

[57] ABSTRACT

Repetitive data and non-repetitive data, including periods of no information, is encoded prior to transmission or storage in digital form to minimize the memory space required for storage or the time required to transmission. Repetition, partial repetition, and near repetition is encoded in a form indicating the occurrence of repetition, its characteristics and its duration. The existence and size of repeated patterns in the data is dynamically determined. When repetition is detected, non-repetitive data is inserted into the data stream and repeated data is removed from the data stream. To this non-repeated data in the data stream are added a coded repeated pattern sample, an identification preamble signal, an instruction signal for decoding purposes, a period count signal, a mask signal, and a repeat count signal. All necessary data elements are combined and assembled to produce compressed data. A receiver utilizes these coded and uncoded data elements to regenerate complete original data.

74 Claims, 11 Drawing Sheets

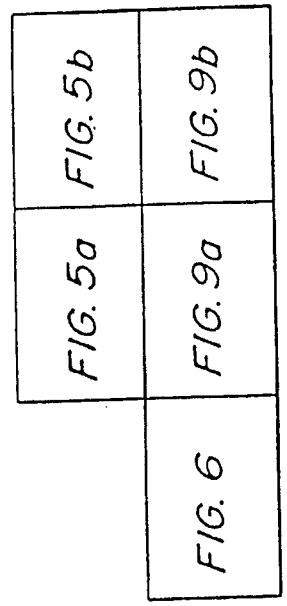
FIG. 4
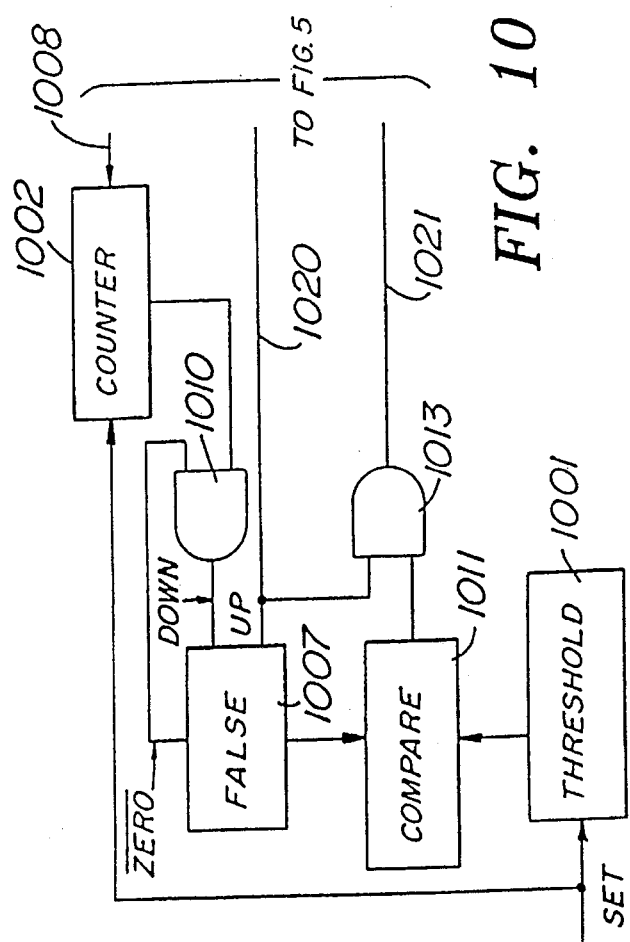
FIG. 11
FIG. 10

DATA IN 4 BIT CHARACTERS

```
1 1 0 0 ⎫
1 1 0 1 ⎪
1 0 0 1 ⎬ 20 BITS
1 0 0 0 ⎪
1 0 0 0 ⎭
```

MASK

FIG. 8a   1 0 1 0   DESIGNATES REPEATED BITS

DATA TRANSMITTED

```
1 1 0 0  ⎫ ← PATTERN
1   1    ⎪
0   1    ⎬ 12 BITS
0   0    ⎪
0   0    ⎭
```

DATA FROM A CVSD ENCODED AUDIO TONE
(2 KHz @ 32 KHz SAMPLING RATE)

```
1 1 1 1 1 0 1 1 0 0 0 0 0 1 0 0 ⎫
0 1 1 1 1 0 1 0 1 0 0 0 0 1 0 1 ⎪
0 1 1 1 1 0 1 1 0 0 0 0 0 1 0 1 ⎬ 80 BITS
1 1 1 1 1 0 1 0 1 0 0 0 0 1 0 0 ⎪
1 1 1 1 1 0 1 0 1 0 0 0 0 1 0 0 ⎭
```

MASK 0 1 1 1 1 1 1 0 0 1 1 1 1 1 1 0

DATA TRANSMITTED

```
1 1 1 1 1 0 1 1 0 0 0 0 0 1 0 0 ⎫ PATTERN
0         0 1             1     ⎪
0         1 0             1     ⎬ 32 BITS
1         0 1             0     ⎪
1         0 1             0     ⎭
```

FIG. 8b

ASCII NUMBERS

```
0 0 1 1 0 0 0 0
1 0 1 1 0 1 0 0
1 0 1 1 1 0 0 0
0 0 1 1 0 1 1 0
1 0 1 1 0 1 0 0
```
} 40 BITS

MASK
0 1 1 1 0 0 0 1

DATA TRANSMITTED
```
0 0 1 1 0 0 0 0
1       0 1 0
1       1 0 0
0       0 1 1
1       0 1 0
```
} 24 BITS

DATA COMPRESSION BY REMOVING REPETITION AND UNNECESSARY INFORMATION

This application is a Continuation of application Ser. No. 08/127,013 filed Sep. 24, 1993, U.S. Pat. No. 5,434,568, which in turn is a Continuation of application Ser. No. 07/531,631, filed Jun. 1, 1990, now abandoned, which in turn is a Continuation of application Ser. No. 06/690,478, filed Jan. 10, 1985, abandoned, the disclosures of which are incorporated by reference herein.

BACKGROUND OF THE INVENTION

The principal objective of the present invention is to minimize the digital storage space or time required for storing or transmitting digital data by eliminating repetitions, partial repetitions and near repetitions. The present invention is thus primarily concerned with conserving the storage space or time used to digitally store or transmit information. The information to be stored or transmitted may be analog of any frequency before it is converted to digital or it may be digital data of any kind. The invention relates to detecting repetitious data regardless to the data's origin. It detects repetition, partial repetition, and near repetition in the digital form.

The present invention accomplishes its purpose by not storing bits of information that are unnecessary or that can be easily reproduced. Therefore, the invention has many applications in devices where it is desired to conserve storage space or transmission time.

Applications:

Some examples of applications in which the present invention is particularly useful to minimize storage are as follows:

Recorded message systems
Recorded announcement systems
Dictation systems
Speech synthesizers
Speech recognition systems
Speech comparison or identification systems
Video storage systems
Packet storage systems
Tone interval timing
Tone synthesizers
Computer data reduction
ASCII data storage (b 2out of 8 bits repetitious for upper case letters; 3 out of 8 bits for numbers)
Strip repetitive control information of any type or frequency
"No information" removal where it constitutes any form of repetition Some examples of applications in which the present invention is particularly useful to minimize time for transmission are as follows:

Digital telephone carrier systems
Statistical multiplex systems carrying voice and/or data
Packet transmission systems
Video transmission systems
Data transmission systems
ASCII code transmission (i.e. 2 out of 8 bits repetitious for upper case letters; 3 out of 8 bits for numbers)
Strip repetitive control bits 10
Implementation of TASI
Enhancement of DSI Detecting repetitions in data of information is known. Coded signals have been substituted for repetitive data at a transmitting end. When the coded signals are detected at the receiving end, the repetitive data originally omitted from the transmission is recreated. Two such patents describing such systems include U.S. Pat. Nos. to Moll 4,280,192, issued Jul. 21, 1981 and 4,412,306, issued Oct. 25, 1983.

Many times, a series of signals do not have all bits 20 repetitive but include some repetitive bits, which still take up storage or transmission space. It is desirable that this "partial repetition" be detected, not transmitted and be reproduced at a receiver.

OBJECTS OF THE INVENTION

It is an object of this invention to provide improved circuitry for eliminating partial repetitions in signals at a transmitter and reproducing the partial repetitive signals at a receiver.

It is a further object of this invention to provide an improved system for suppressing the transmission of repetitive signals from a source when the number of repetitive signals exceed a predetermined threshold and reproducing the repetitive signals at a receiver.

BRIEF SUMMARY OF THE INVENTION

In accordance with the present invention, signals or periods of signals which are repetitive, partly repetitive or near repetitive are detected in a series of signals the be transmitted. The locations, characteristics such as number of groups involving repetition, and duration of the repetitions detected are coded and the repetitive signals are not transmitted. The transmitted signals including the coded signals are transmitted to a receiver which responds to the coded signals to cause the repetitive signals originally suppressed at the receiver to be reproduced.

Other objects and advantages of the present invention will be apparent and suggest themselves to those skilled in the art, from a reading of the following specification and claims.

DESCRIPTION OF THE DRAWINGS

FIG. 4 is a block diagram illustrating a control data format which may be used in practicing the present invention;

FIG. 8a, 8b, 8c and 8d illustrates examples of digital signals and how such signals may be compressed when repetition is detected;

FIG. 10 illustrates a threshold level tolerance control circuit for repetitive signals to be suppressed, and FIG. 11 is a view illustrating an arrangement of FIGS. 5, 5b, 6, 9a and 9b which may be used to produce a composite circuit to assist in a better understanding of the present invention.

DESCRIPTION OF THE INVENTION

Figure 1:
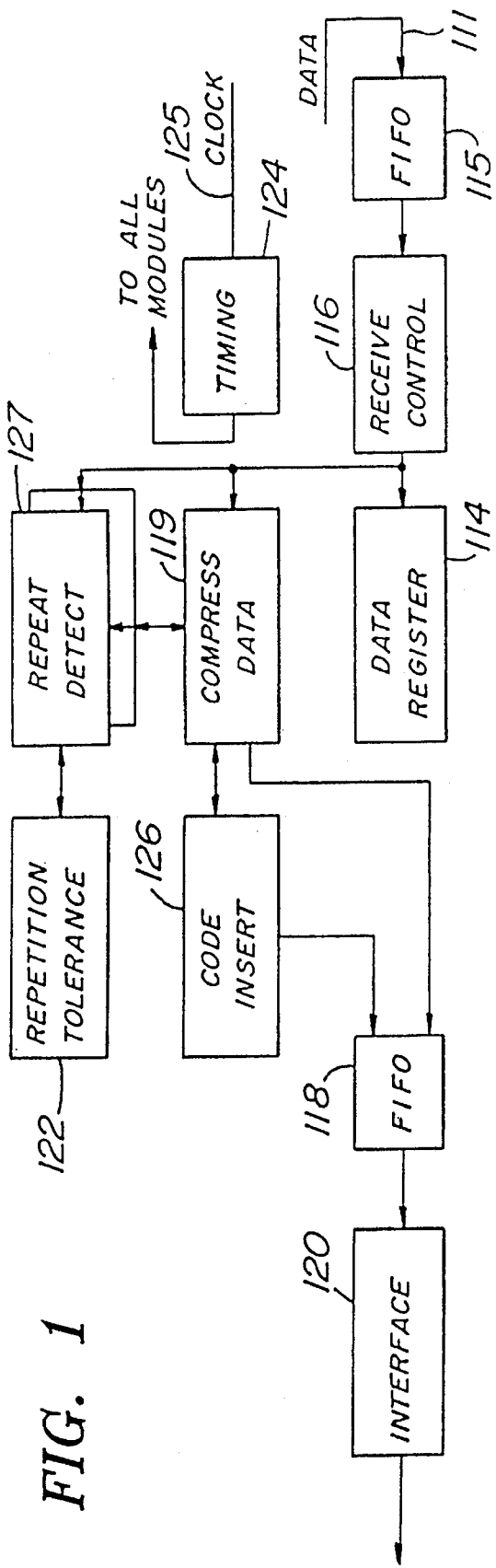
FIG. 1 is a block diagram illustrating a detection and compression system at a transmitter, in accordance with the present invention.

Before describing the invention in detail, the overall concepts will be described briefly.

The purpose of the system involved in the invention is to minimize digital storage space or time required for transmitting digital data by eliminating repetitions, partial repetitions, and near repetitions. The information to be stored or transmitted, while not restricted to any type, may be analog of any frequency before it is converted to digital or it may be digital data of any kind. The system looks for repetition in data regardless to the data's origin. It looks for repetition, partial repetitions, and near repetition in the digital form.

This system accomplishes its purpose by not storing or transmitting bits of information that is unnecessary or that can be easily reproduced such as contiguous repetitive bits, periodic sections of repetitive bits, periodic individual repetitive bits and "no information" repetition. This system, therefore, has many applications in devices where it is desired to conserve storage space or transmission time.

Repetitive information, including periods of no information, is encoded prior to storage or transmission in a digital form for minimizing the space required for storage or time required for transmission of the digital information. The repetition is encoded in a form indicating the occurrence of the repetition, its characteristics, and its duration. Data is compared with prior received data to detect repetition. The size of the expected repeated pattern is dynamically determined from the data as it enters the system. This is done with different modules of logic, each looking for a different character size (period). A small separate counter is used for each bit in the period to detect repetition of parts of periods.

When repetition is detected, by one or more of the counters, a repeated pattern sample and the period of repetition is noted. Depending on the system used, this information is either inserted into the data stream, stored in a reserved section of memory or placed on a separate transmission channel. The originally received data is restored by decoding networks which regenerate and reinsert the repeated data.

This theory is applicable to all types of digital data whether it originates as analog voice, video pictures, computer data, etc. This system can be made tolerant of occasional bit reversals which would negate a long string of repetitive patterns when dealing with data such as digitized speech, video pictures, etc. which may accept minor errors.

Digital transmission or storage may sometimes be tolerant of isolated bit transpositions or bit errors. This system allows for various error criteria in defining repetitive and size of repetitive blocks. CVSD encoded voice often exhibits bit patterns showing little change which are not critical or perceptible to the user. Another example is digitized video where some bits are not critical to the quality of overall performance. Variable criteria can be predetermined or dynamically determined.

Partial repetition data compression has potential in the digital encoding of voice and video. When CVSD coding is used, particularly at high amplitudes and with sine waves or vowel sounds, there are repetitive sets of ones and sets of zeros in the data. The few bits of jittering of ones and zeros is tolerated between the sets, allowing this system to perform its function when the tolerance factor is built into the logic.

When Pulse Code Modulation (P&M) coding is used, a very high percentage of partial repetition of some bits is found at low amplitudes, partial silence, and silence. This occurs because PCM is an 8 bit binary number (7 magnitude plus one sign bit) expressing the absolute magnitude of the analog signals at a given point in time. When this amplitude remains low, the most significant bits are always the same, which may yield up to a 37½% savings (minus overhead). The sign bit also exhibits a repetitive pattern at fundamental frequency.

In describing the present invention, it is necessary to refer to a number of different figures when describing a particular figure. In order to facilitate this condition, reference numerals have been assigned in the hundreds, with the initial digit or digits corresponding to the figure in numbers.

FIG. 1

FIG. 1 of the subject application is similar in many respects to FIG. 1 of U.S. Pat. Nos. 4,280,192 and 4,412,306. The circuitry illustrated is designed to receive incoming data. The incoming data is examined for repetition. When repetition is detected, coded signals are generated and inserted into the data to be transmitted without transmitting all the repeated data. Prior to the transmission of the coded signals, the data must be compressed and in some cases a repetition tolerance circuit is used. FIG. 1 of this application differs from FIG. 1 of the aforementioned patents primarily in the provision of a compress data circuit and the repetition tolerance circuit.

Referring to FIG. 1, a stream of digital input bits from line 111 is fed through a FIFO 115 (First-in First-out buffer) which acts as a form of delay line to a receive control circuit 116. The output signals from the receive control circuit 116 are applied to a data register 114, a compress data circuit 119, and a repeat detect circuit 127.

The FIFO 115 makes allowances for the short term data transfer time differences between the incoming data and the system pauses. The receive control 116 eliminates or modifies all bit configurations which could be mistaken for a preamble (explained later).

The data register 114 stores a sufficient number of incoming bits as required by the repeat detect 127 to preform its function. Compress data circuit 119 stores the same incoming bits as the data register 114 in a memory with sufficient capacity to temporarily hold data until repetition is detected, coded and compressed.

A code insert circuit 126 applies a preamble and appropriate code(or codes) into the output data stream via a FIFO circuit 118 and interface 120. Details of the code insert 126 will be described in connection with FIG. 6. The FIFO circuit 118 function is used to provide a variable length register for facilitating insertion of the codes at the appropriate location in the data stream in order to compensate for the time it takes the logic to perform its function.

Repetition of data in the data register 114 is detected by the repeat detect circuit 127, which may include more than one repeat detect circuit. As the digital input is received in the data register 114 from the receive control 116, the bit pattern is compared in each module or circuit in the repeat detect module 127, in accordance with the period size at which it is to function. The module period sizes may vary from 3 through n depending on the system requirements and the type data expected.

Figure 9A:
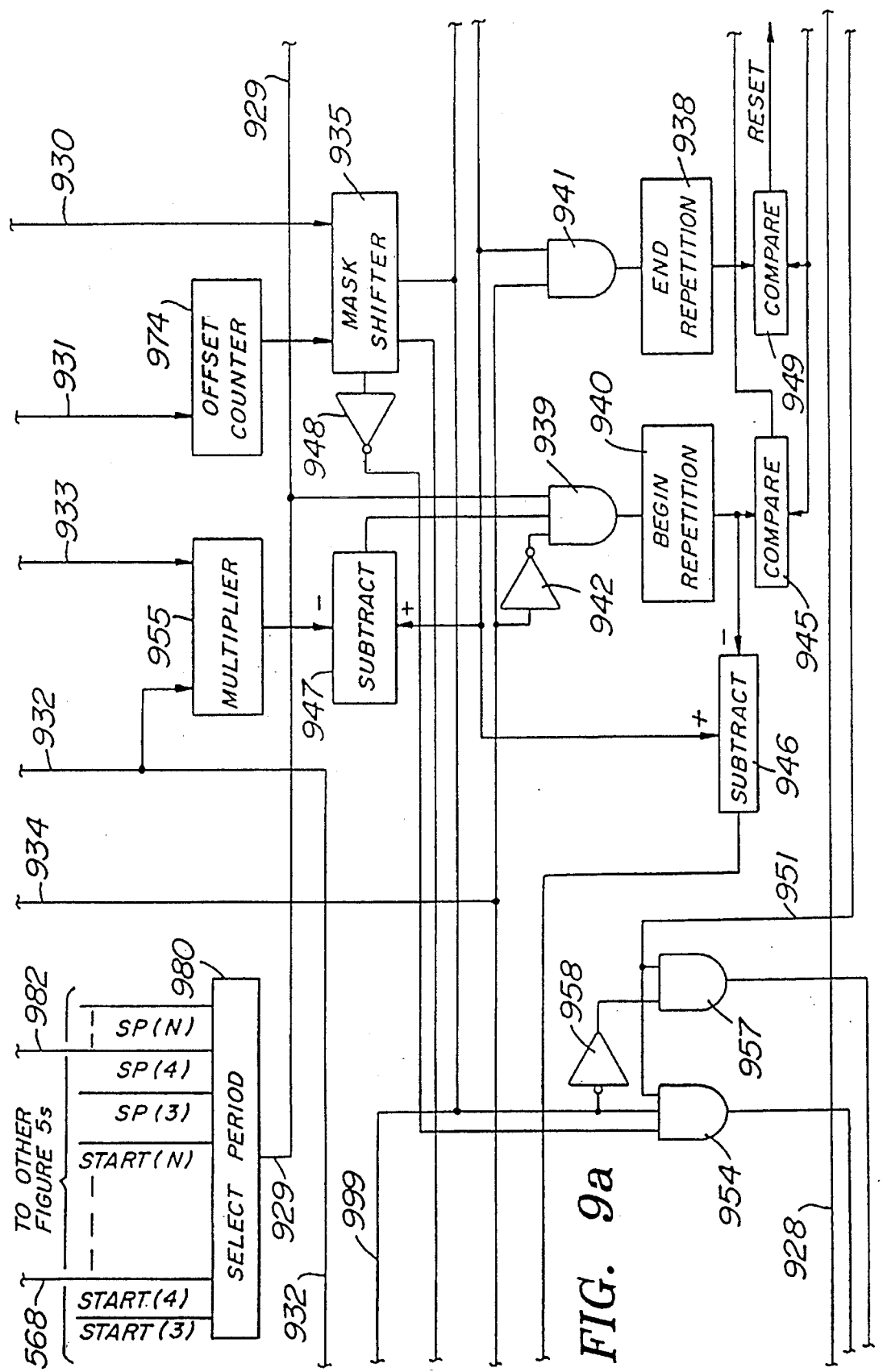
FIG. 9a and 9b illustrate details of a compress data circuit showing a block in FIG. 1.

When more than one repeat detect circuit in the repeat detect modules 127 has simultaneously found a repeated pattern, the select period 980 (FIG. 9, to be described) in the compress data circuit 119 selects the optimum period size as predetermined by system parameters.

A timing circuit 124 receives a clock signal from line 125. The output signals from the timing circuit are applied to the receive control circuit 116, the FIFO circuit 115, the compress data circuit 119, the repetition tolerance circuit 122, the repeat circuit 127, the data register 114, the code insert circuit 126 and the FIFO circuit 118.

FIG. 4 represents the control data which characterizes the repetition for regeneration. This data includes a repeat pattern 457, a preamble 460, instruction 462, period count 464, mask 465 and repeat count 466, followed by data not repeated 468.

Referring to FIG. 4 along with FIG. 1 when a sufficient number of equal comparisons or repetitions have been made in a manner to be subsequently described, the repeat pattern 457 includes the group of signals to be repeated. The number of times it is repeated is determined by the subsequent signals.

The preamble 460 code is inserted into the FIFO 118 data by the code insert 126 immediately after a sample of the pattern 457 to be repeated. The instruction 462, a period length code 464, and a mask 465 to show which bits are repeated, follow the preamble. No further data is allowed to progress from the compress data 119 to the FIFO 118 until an unequal comparison occurs or the system capacity has been exceeded in terms of time or memory space. At that time, the repeat count 466 value representing the number of times a group of signals in the repeat pattern 457 is repeated, is inserted into the FIFO 118 immediately after the mask signal 465, which includes signals indicating which bits in a group of signals are repetitive. Data from the compress data 119 is then inserted into FIFO 118.

Mask signals are herein defined as being control signals used to control the operation of a compressor circuit at a transmitting end to inhibit the transmission of repetitive signals. These same mask control signals are also used to reinsert the repetitive bits at the receiving end.

The repetition tolerance circuit 122 is connected to repeat detect 127 which affects compress data 119 when this system is used in an application where some errors are acceptable as further described with FIG. 10. Otherwise, repeat detect 127 directly affects compress data 119. The compress data 119 will be further described in connection with the descriptions of subsequent figures.

FIG. 2

Figure 2:
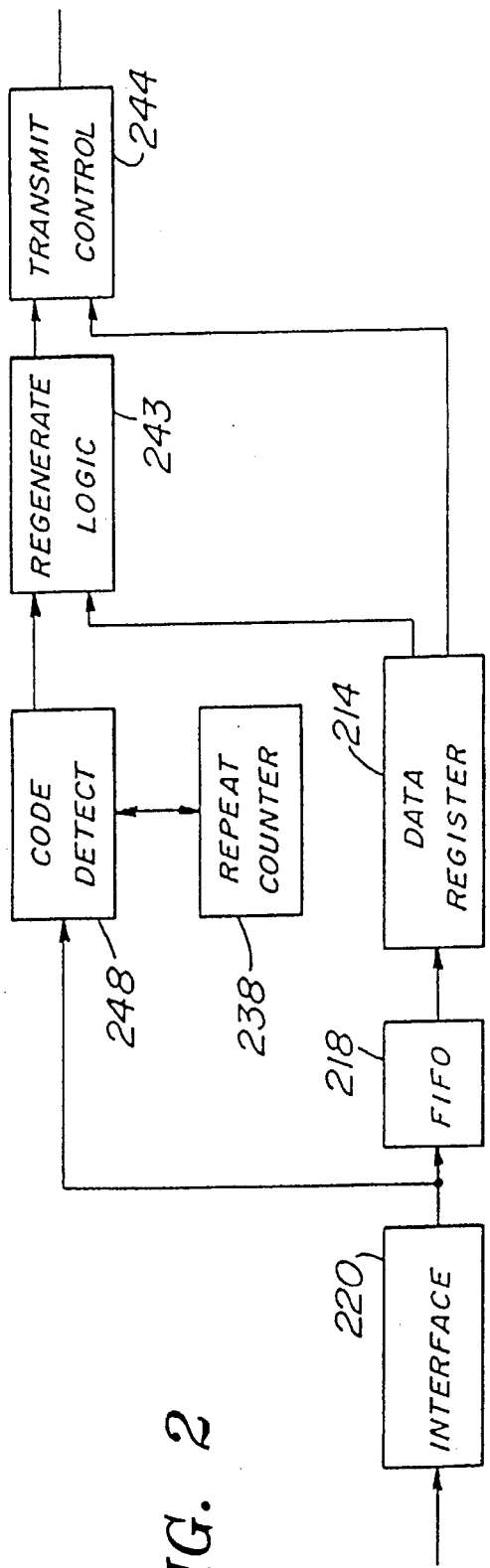
FIG. 2 is a block diagram illustrating a receiver for receiving and decoding signals from the system illustrated in FIG. 1, in accordance with the present invention.

FIG. 2 is similar in many respects to FIGS. 2 of the aforementioned patents. This application, however, provides a regenerative logic circuit. The regenerate logic circuitry reinserts the individual data bits as they were originally received.

Refer to FIG. 2, a logic functional diagram of the reproducing portion of the present invention is illustrated, some of the elements of which may be similar to elements of FIG. 1. The stored digital data originating at a transmitting end illustrated in FIG. 1 is sent from storage or a computer through an interface 220 and a FIFO circuit 218 to data register 214. The data is extracted from the data register 214 through a transmit control circuit 244. The digital data is also applied from the interface 220 to a code detector 248. The code detector circuit 248 is continuously looking for codes such as preambles, instruction codes, period length, masks, number of repeat periods and the like, as illustrated in FIG. 4. The code detector 248 turns on a regenerate logic circuit 243 which turns on and off the transmit control circuit 244 which, in turn, turns on and off the data extracted from the data register 214.

A preamble (FIG. 4) identifies the position of all codes, instructions and repeat pattern. When a preamble signal 460 is sensed, the code detector 248 initiates a command decode. The transmit control 244, under control of regenerate logic 243, gates data out of the data register 214. The transmit control 244 can gate the data from the regenerate logic 243 or the data register 214. The original signal is recreated partly by the data register 214, code detect 248, regenerate logic 243, and the transmit control 244.

FIG. 3

FIG. 3 illustrates the method of controlling and manipulating data as it progresses through the system. Basically, data involves a plurality of sequential groups of signals. The groups of signals must be stored and examined for repetitions and insertion of coded signals before they can be transmitted.

Figure 3A:
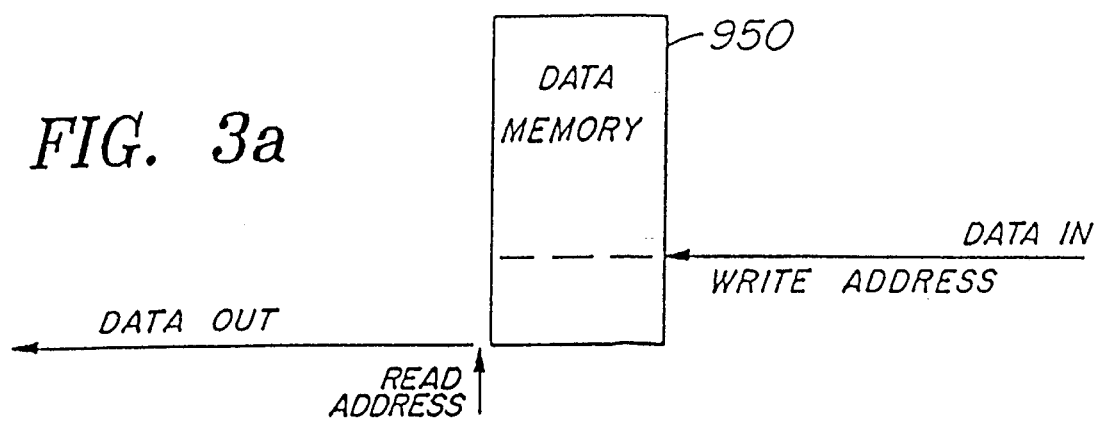
FIG. 3(a), (b), (c), and (d) are block diagrams schematically representing some of the steps involved in the present invention, shown for purposes of explanation.
Figure 3B:
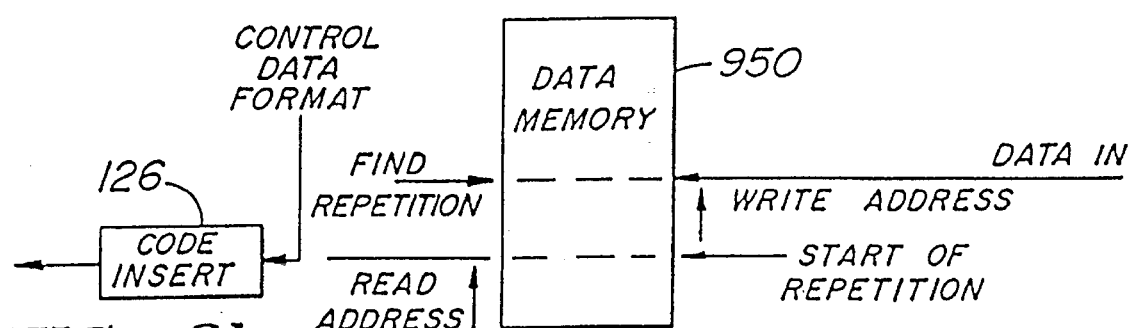

FIG. 3a illustrates writing incoming data into a data memory 950, which may form part of the compress circuit 119. A write address counter counts upward from zero, bit by bit as it progresses. Sometime later, the data is read from memory bit by bit in the same order as it was written. The read address counter also counts upward from zero but lags behind the write address counter by, for example, 256 bits.

The incoming data is monitored for repetitious bits at the same time that it is written into memory. When repetition is found (FIG. 3b), the read address counter stops while the writing of data and verification of repetition continues. Coded control information (FIG. 4) is inserted from the code insert circuit 126 into the data stream to describe the configuration and parameters of the repetition.

Figure 3C:
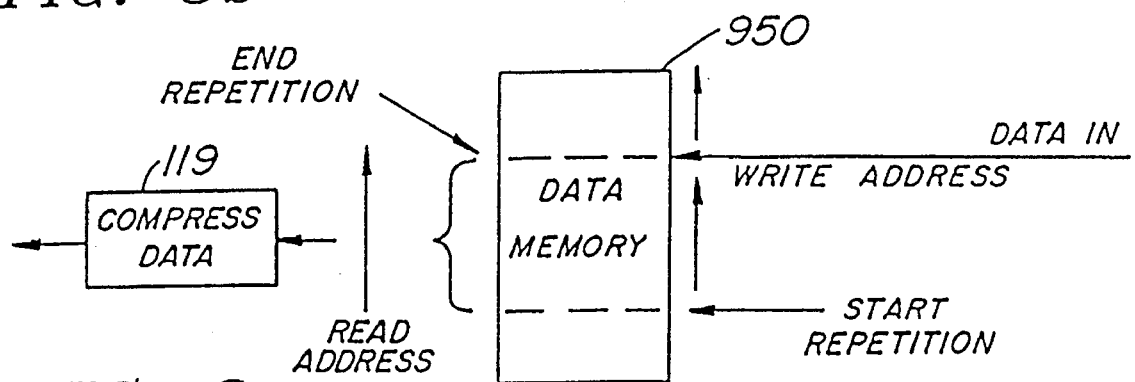
Figure 3D:
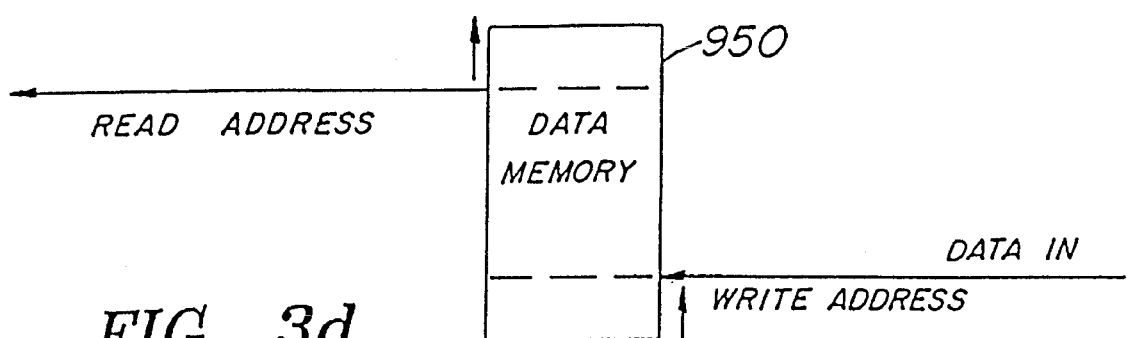

When the incoming data is defined sufficiently, the data is compressed as it is read from memory by outputting only the bits which were not found to be repetitive (FIG. 3c). When the read address counter matches an end repetition address, the compression is complete.

The read and write address counters are modulo counters (FIG. 3d) which start again at zero when they reach maximum memory size, thereby effectively making the memory seem endless. In systems where data compression is not done in real time while data is being written into memory and if the repetition block approaches the memory capacity, the occurrence of repetition is temporarily ignored until the data compression process makes more memory space available.

FIG. 4

FIG. 4 is similar to FIGS. 3 of the aforementioned patents except for the addition of a section entitled "mask" 465 and "data not repeated" 468. A series of mask signals indicates the bits which are repeated and the bits which are not found to be repeated.

FIG. 4 illustrates the control data format of the general type which may be inserted into the data stream via the FIFO 118 of FIG. 1. Pictured to show the data moving out to the left toward the interface 120, the first position is the normally stored data which was detected to be repetitive, referred to as repeat pattern 457.

In this embodiment, FIG. 4 illustrates the control data format which is inserted into the data. The determination of the insertion point of these control bits will be covered later with the compress data. The control data is inserted beginning with the 36 bit preamble 460, 4 bit instruction 462, 8 bit period count 464, the mask 465, and the 16 bit repeat count 466.

The preamble 460 is next sent and may comprise, for example, 32 ones, two zeros, and two ones. The preamble format may be a different bit configuration. The preamble purpose is to alert the code detect logic 248 to special instructions to be followed in order to reproduce repetitive data, etc.

The instruction 462 which follows the preamble may, for example, contain 4 bits. The period count 464 may contain 8 bits which is a binary number specifying the actual number of bits which are contained in the repeat pattern immediately preceding the preamble. The mask 465 will contain ones for the repetitive bits and zeros to designate the bit positions which were not found to be repetitive. The number of bits in the mask 465 are the same as the number of bits in the pattern.

The repeat count 466 may contain 16 bits which is a binary number specifying the actual number in terms of total bit times that the pattern is repeated. The repeat count 466 is used to recover the data bit configurations originally inserted into the FIFO 115 of FIG. 1.

FIG. 5

Figure 5A:
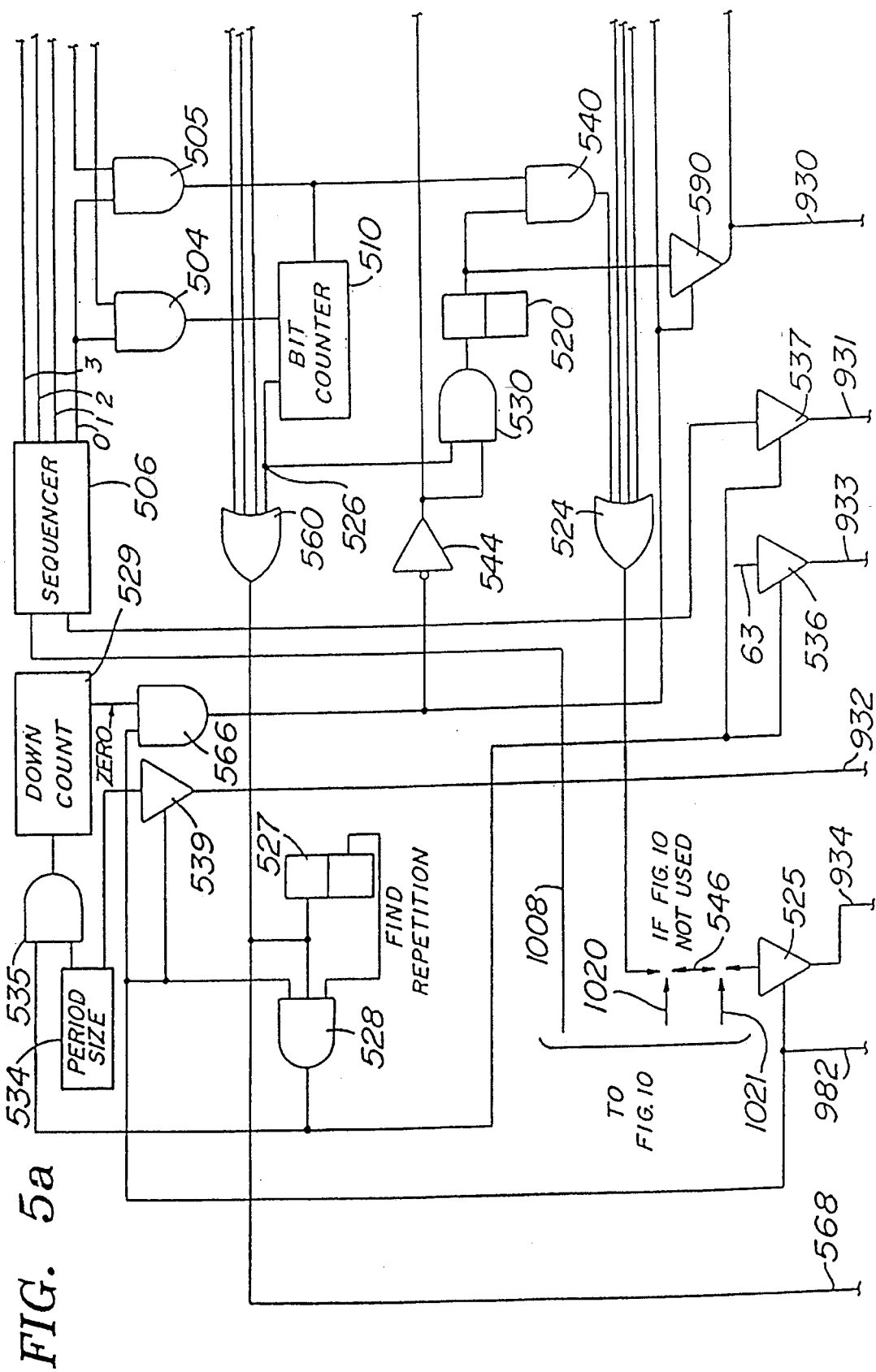
FIGS. 5a and 5b illustrate details of the repeat detect circuitry involved in one of the blocks in FIG. 1.

Referring to FIGS. 1 and 5, details of one example of a repeat detector circuit 127 is illustrated. Generally, a complete or partial repetition is detected in the repeat detect 127 by comparing each bit of the respective period size with the same bit in succeeding periods as they are received. Various output signals from the repeat detect 127 are used to control operations of circuits in FIGS. 9 and 10. The consecutive true comparisons are accumulated individually for each bit until the savings of bits are greater than the control word bits that need to be used.

A 4 bit period size repeat detect model is used to explain partial character repetition detection, elimination, and regeneration. When additional bit periods are involved, more than one repeat detect circuit will be used. Thus, the basic circuitry of FIG. 5 may be duplicated a number of times in a system, dependent upon the number of different periods expected.

Figure 5B:
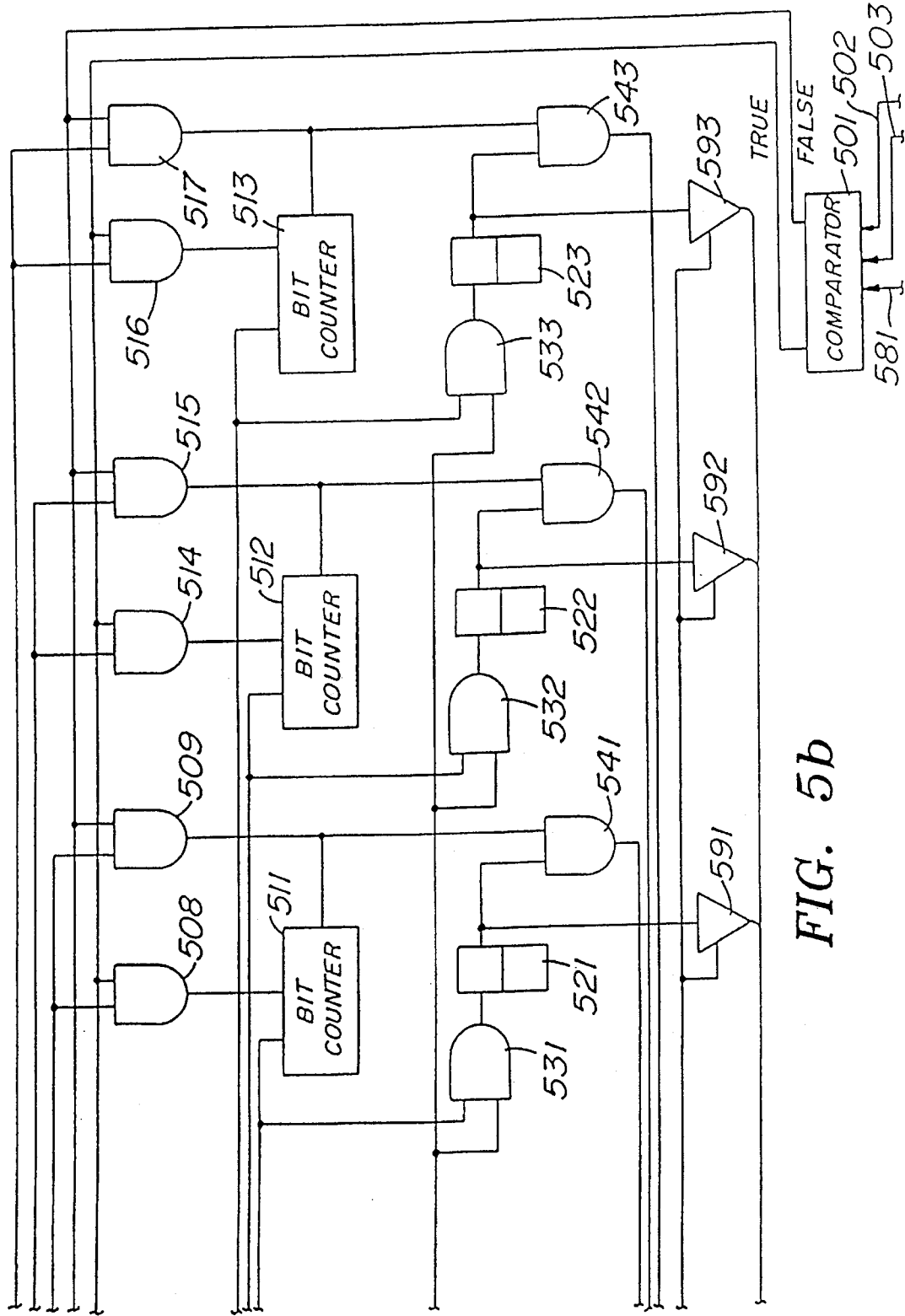

With a 4 bit period, each of the bits is compared with its respective bit position of the succeeding period by using an EXCLUSIVE OR logic array comparator 501 (FIG. 5b). An individual counter is used for each consecutive true comparison, i.e. when the bit signals in consecutive periods are the same.

The counter is reset each time a false comparison results, i.e. when corresponding bits in consecutive periods are different. The individual counters are selected in sequence at the same rate as the data is written into a data memory 950 (FIGS. 3 and 9) and shifted into the data register (FIG. 1) 114. When one or more of the counters reach an accumulation of 63, compress data circuit 119 (FIG. 1) is notified and the code insert circuit 126 (FIG. 1) is enabled. The code insert circuit 126 inserts a portion of the control data format (FIG. 4) into the data stream. The mask register circuits 465, 520, 521, 522, 523 (FIGS. 4, 5a and 5b) contains one's to indicate which bits have been found to be repetitive and zero's to show which bits were not found to be continuously repeated.

The purpose of the circuitry in FIG. 5 is to detect repetition in data regardless of whether the repetitive bits are contiguous. Multiple repeat detect modules are used when the distance between the repetitive bit patterns (the period size) is unknown. The method illustrated here is for a relatively small period size. Logic can be added to detect repetitive bits in periods which are larger. An example of a large period may be a Continuously Variable Slope Delta (CVSD—digitally encoded voice) signal of 800 Hz sample at 32 kilobits per second. This would be a 40 bit repetitive or partially repetitive pattern.

1) Find Repetition:

The circuitry of FIG. 5 may generally be included in the block referring to the repeat detect circuit 127 in FIG. 1, with additional details having been added. Comparator 501 compares the input signals at 502 from the serial data register 114 with the 4th bit of the data register 114 on line 503.

All flip flops, counters, and sequencing logic of FIG. 5 are reset at the start of a cycle. If a true comparison is made by the comparator 501, a bit counter 510 is incremented via AND gate 504. If a false comparison is made, the reset position of the bit counter 510 is activated via AND gate 505 causing the bit counter 510 to start anew. All the other counters, 511, 512, and 513 and their respective AND gates 508, 509, 514, 515, 516 and 517 operate in the same manner as counter 510 and its AND gates 504 and 505. All the bit counters have their output leads connected to OR gate 560.

A sequencer 506 is incremented by using an inverted bit clock so that the incrementing occurs between bit times, and the AND gates 508 and 509 are enabled before the next bit time. When the data register 114 shifts again, the next bit is compared once again with the 4th bit position in the data register 114. A true comparison increments the bit counter 511 via AND gate 508. If a false comparison is made, the reset position of bit counter 511 is activated via AND gate 509 causing the bit counter 511 to start anew. The sequencer 506 is incremented enabling AND gates 514 and 515 before the next bit time. The operation continues for counter 512, followed by operation of AND gates 516 and 517 and counter 513.

As the data register 114 shifts in subsequent bits, one at each bit clock, the comparator 501 either increments or resets the appropriate counters in the process. The sequencer 506 is a modulo four counter. Each of the bit counters 510, 511, 512 and 513 will accumulate the number of successive repetitions, or reset to start over if any false comparison is found for that particular bit.

The bit counter threshold for sending the compress data 119 (FIG. 9a) enable signals by way of line 568 is at the count of 63 in any of the bit counters 510, 511, 512 and 513. The criteria for setting ones in the mask register is when any individual bit counter reaches 63. Other thresholds which are different than 63 may be desirable for applications such as voice encoded CVSD, PCM or ADPCM.

When any of the counters 510, 511, 512 or 513 reaches the count of 63, OR gate 560 will request recognition from select period 980 (FIG. 9) which insures that only one of the repeat detect circuits (FIG. 5) is chosen when more than one is used. Making this choice, select period circuit 980 notifies compress data circuit 119 via lead 929 which later causes code insert 126 (FIG. 1) ENABLE circuit 682 by way of gate 968 and line 928 in FIG. 9 to start its process (as described in FIG. 6 of the aforementioned patents) of inserting control data into the data stream further described in connection with FIGS. 3 and 4.

There may be 1, 2, 3 or 4 bits of an n=4 bit period repeated 63 times. When at least one of the four bits is repeated 63 times, all of the bit counters 510, 511, 512 and/or 513 which have reached 63, set their respective flip flops 520, 521, 522 and 523. These flip flops are called the mask register. The flip flops 520. 521, 522 and 523 also enable AND gates 540, 541, 542 and/or 543 preparing for a false comparison to activate OR gate 524 which will indicate "end of repetition" to FIG.9 to be described later.

If repetition continues to the extent that the memory capacity of the system as designed is exceeded or if the application of the system is such that delay time through the system is critical, comparator 501 is forced false via OR gate 960, described later in FIG. 9.

2) Find Repetition Example:

Using the case when bit counter 510 was the first of a four repetitious bit pattern to reach its 63rd consecutive true comparison, lead 526 sets flip flop 520 via AND gate 530.

Figure 9B:
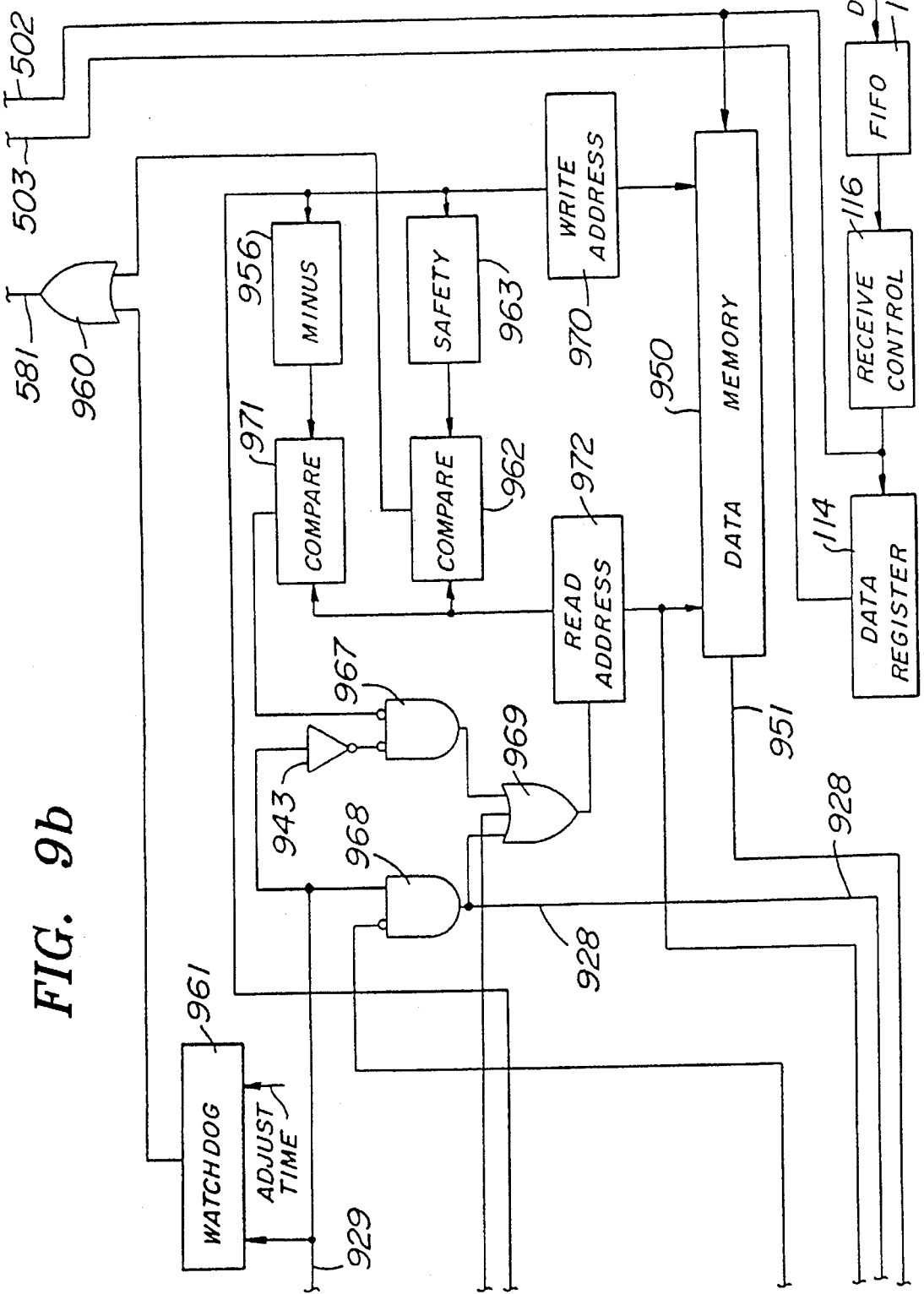

Select period circuit 980 of FIG. 9 is activated by lead 568, OR gate 560 and lead 526. The select period circuit 980 uses a high frequency clock so that the time to activate a select period line is negligible. Select period 980 activates lead 929 to be explained later with the circuitry included in FIG. 9 storing the begin address of repetition.

A down counter 529 is asychronously preset with the period size as controlled by the select period circuit 980, select period lead 982, lead 568, flip flop 527, AND gate 528 and AND gate 535. Presetting down counter 529 allows all the other mask register flip flops 521, 522 or 523 a chance to reach 63 one more clock time before being inhibited by downcount 529 at zero into AND gate 566 and inverter 544 to AND gates 530, 531, 532, and 533. The binary number 63 is sent to multiplier 955 on lead 933 by tri-state driver 536 enabled by AND gate 528.

The period size circuit 534 applies signals to the multiplier 955 via lead 932 and tri-state driver 539. The period size circuit 534 is enabled to the code insert circuit 126 AND gate 602 via lead 932 and tri-state driver 539 enabled by select period lead 982. The offset counter 974 input is loaded with the current sequencer 506 count via leads 931 and tri-state drivers 537.

AND gate 566 enables tri-state drivers 590, 591, 592 and 593 when down count 529 has reached zero indicating that the remaining three bit counters 511, 512 and 513 have had an opportunity to reach the count of 63 and set their respective flip flops 521, 522 and/or 523.

At the next bit clock bit counter 511 reaches 63 and sets flip flop 521 via AND gate 531. Down count 529 goes to two.

The next sequential bit clock causes bit counter 512 to reach 63 which sets flip flop 522 via AND gate 532. Down count 529 goes to one.

The next sequential bit count causes bit counter 513 to reach 63 which sets flip flop 523 via AND gate 533. When the downs count 529 goes to zero, the mask shifter 935 is loaded with the mask flip flops 520, 521, 522 and 523 contents via tri-state drivers 590, 591, 592 and 593 enabled by AND gate 566.

The mask register flip flops 520, 521, 522 and 523 states are preserved by disabling AND gates 530, 531, 532 and 533 via inverter 544 AND gate 566 going true when the down count 529 reaches zero.

3) End Repetition:

When repetition is found and the mask register configuration is established, the related enabled AND gates 540, 541, 542 and 543 continually look for a false indication from comparator 501 via sequentially enabled AND gates 505, 509, 515 and 517. When the comparator 501 emits the appropriately timed false, it activates tri-state driver 525, option lead 546 and OR gate 524 from the above mentioned AND gate selection. Tri-state driver 525 also activates lead 934 as explained with FIG. 9.

4) End Repetition Example:

When the comparator 501 produces a false comparison to enable AND gate 505 for example, lead 934 is activated via AND gate 540, OR gate 524, lead 546, and tri-state driver 525. The activation of lead 934 activates code insert circuit 126 and compress data circuit 119 logic, as will be described in connection with FIGS. 6 and 9, respectively.

FIG. 6

Figure 6:
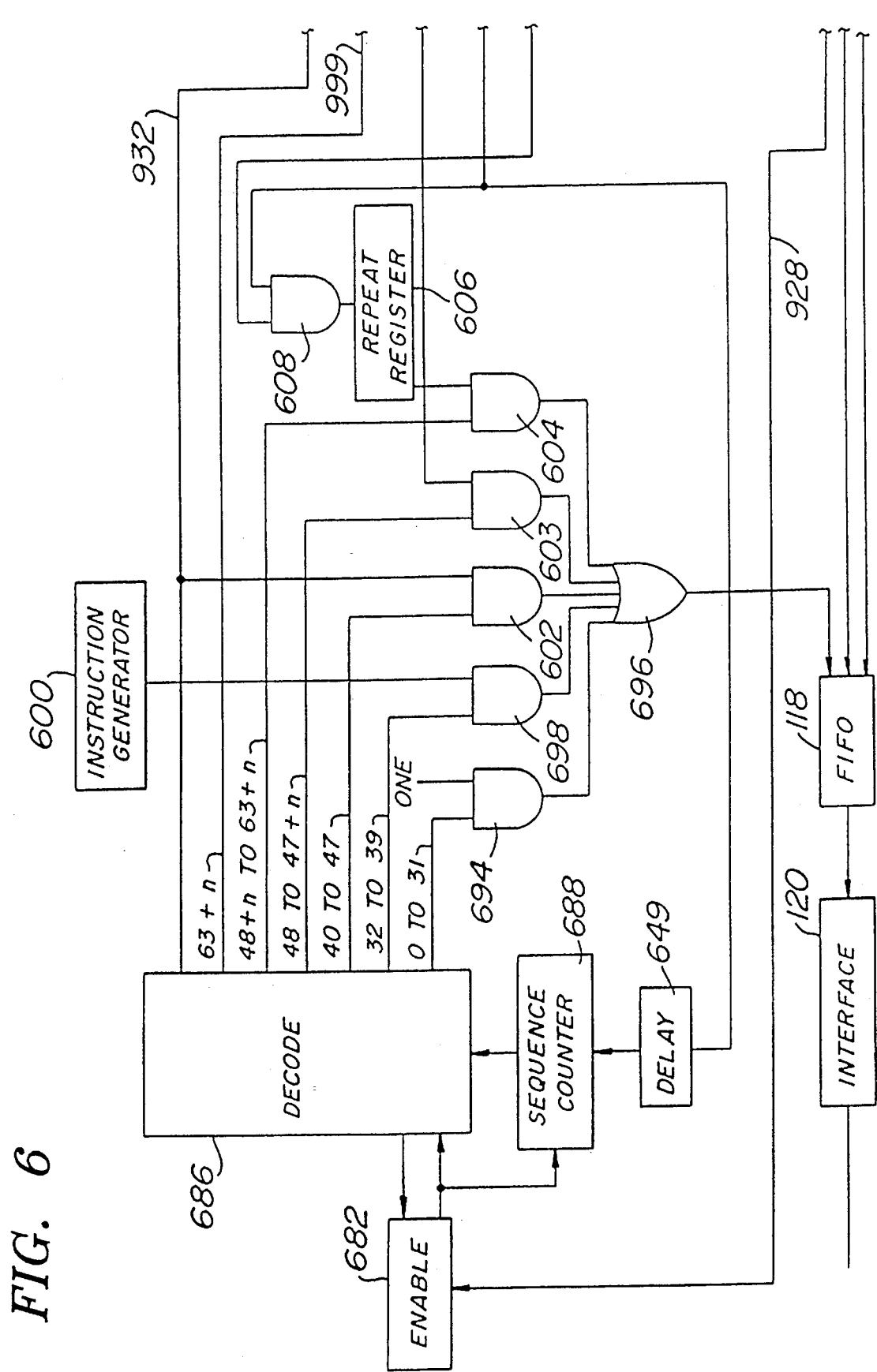
FIG. 6 illustrates details of a code insert circuit shown as a block in FIG. 1.

Referring to FIG. 6 the code insert circuit 126 functions the same as covered in the reference patents with the following exceptions:

1) A mask 465 field (FIG. 4) is added to the control data format.

2) The control data (FIG. 4) is loaded into the data stream via the output FIFO 118 instead of the data register 114.

3) Except for the period size, all the controls of the code insert 126 are performed by compress data 119 instead of repeat detect 127.

When repetition has been found and the data compress 119 has finished outputting data into FIFO 118 ending with the repeat pattern 457 (FIGS. 1 and 4), compare 945 sets enable 682 via AND gate 968. Enable 682 causes sequence counter 688 and decode 686 to load preamble 460, instruction 462, and period count 464 into the data stream via FIFO 118, OR gate 696 AND gates 694, 698, and 602. This part of the prior art is covered in referenced patents on page 8.

The mask field of the control data format is transferred from the mask shifter 935 and inserted by AND gate 603 under control of the sequence counter 688 and decode 686 similar to the other control data format fields. In this case the decode 686 adds the period side n to the control decodes of AND gates 603 and 604 to allow for the variable size mask depending on which repeat detect 127 (FIG., 5) is active.

No further data is moved into FIFO 118 until the final repeat count is known which is when repeat detect 127 OR gate 524 becomes active as described. Until then all incoming data is stored in the data memory 950 in compress data 119 (FIGS. 3 and 9).

All the data containing repetitive bits is held in the data memory 950 until the block size is known and can be inserted into the control data format as the repeat counter. The repetitive bits are then removed as the data is output via FIFO 118. The incoming data can be reduced before the full repeat count is known. However, this will require that the control information is stored in a reserved section of the system using this invention or placed on a separate transmission channel of the network using this invention.

When the end of repetition is determined, repeat detect 127 (FIG. 5) causes the entire repeat block size (FIG. 9) to be loaded into repeat register 606 via lead 934 AND gate 608. The same lead 934 triggers the one clock time delay 649 which allows the sequence counter 688 to wait until the repeat register 606 is loaded.

The repeat register 606 contents is inserted into the control word format. This is the last section of the control data format 466 (FIG. 4) and requires the sequence counter 688 to go from 48+n through 63+n enabling the AND gate 604 to permit data from the repeat register 606 to pass bit by bit through the OR gate 696 into the output FIFO 118. When the decode 686 has reached 63+n, the entire format of the control data has been stored, enable 682 is reset and compression of data begins at lead 999 (FIG. 9).

FIG. 7

Figure 7:
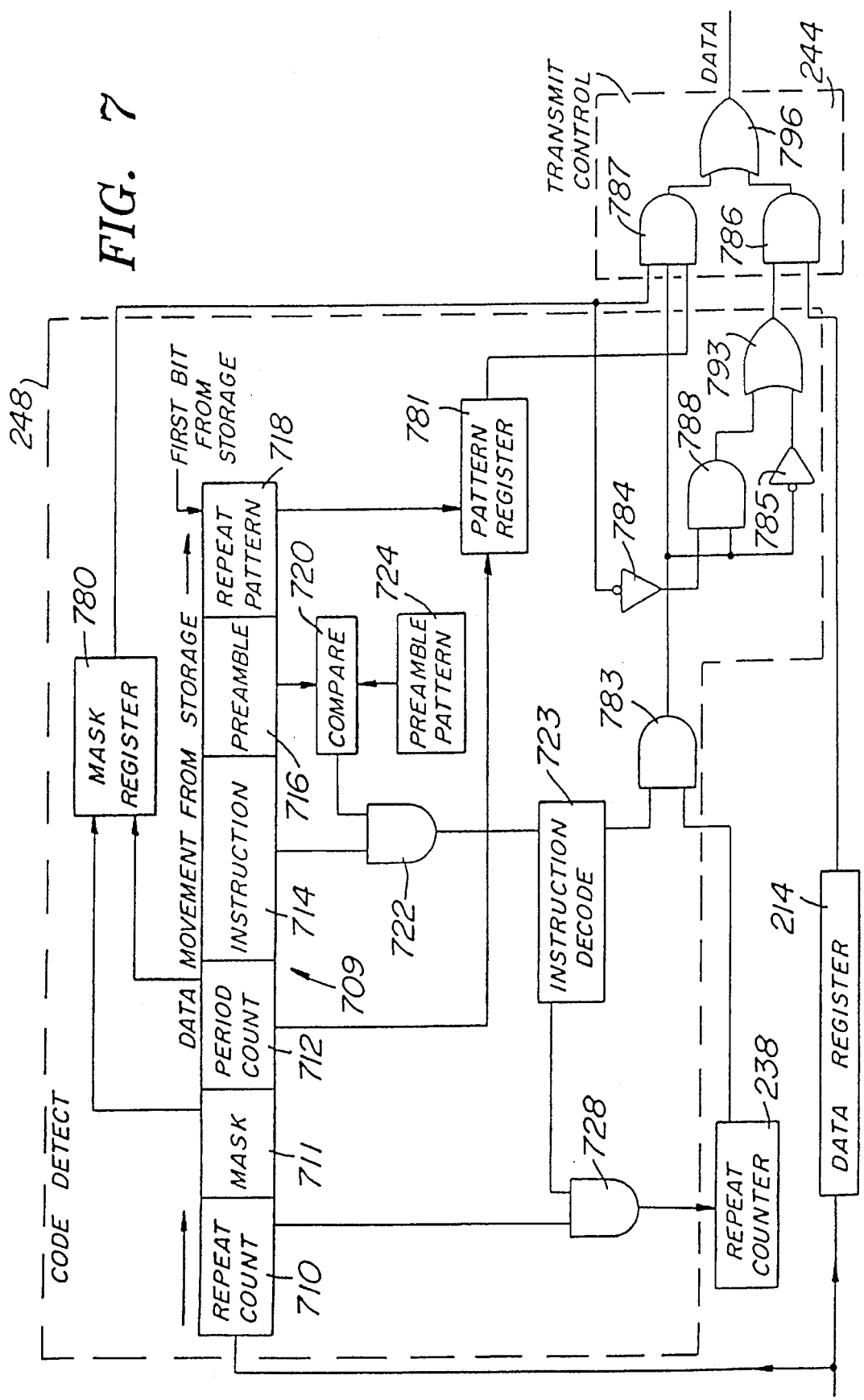
FIG. 7 is a block diagram of a code detect arrangement which may be used with the system illustrated in FIG. 2.

Reference is now made to FIGS. 2 and 7, with FIG. 7 illustrating details of one embodiment of the code detect 248 of FIG. 2. As mentioned, FIG. 2 illustrates a logic functional diagram of the analog data reproducing portion of the present invention, the elements of which may be identical with the elements of FIG. 1. The stored digital data is sent from storage or a computer through the interface 220 and through FIFO 218 to the data register 214. The data is extracted from the data register 214 through a transmit control 244. The digital data is also applied from the interface 220 to the input of a code detector 248. The code detector 248 detects the preamble and executes the instructions sent by the code insert 126 when the repetition was detected and encoded. The code detector 248 is continuously looking for codes such as preambles, repeat codes, period length, mask bits, number of repeat periods and the like.

The code detect 248 is connected at the input FIFO 218 to detect preamble codes before data is processed and to extract such codes before the data is passed all the way through the data register 214. Transmission of the data from the data register 214 to the output is stopped by the transmit control 244 when the code detector 248 detects a preamble and instruction code, and for a time interval determined by the repeat count 466 code (FIG. 4). The transmit control 244 is turned on again by the code detect 248 via regenerate logic 243 at the end of the coded length contained in the repeat count 466. When the code detect 248 detects a preamble and instruction code, the period count 464 (FIG. 4) is used to control the size of a mask register 780 and a pattern register 781. The repeat counter 238 is set to the repeat count 466 code which determines the number of bits to be processed.

The repeat counter 238 counts downward as each bit is processed and when it reaches zero, using AND gate 783, causes the mask register 780 and pattern register 781 to discontinue operation and allow subsequent data to resume its flow through data register 214, AND gate 786 and OR gate 796.

The code detect circuit 248 and transmit control circuit 244 illustrated in FIG. 2 are shown in FIG. 7. The arrangement includes a number of additional blocks already generally described in connection with FIG. 2. These will not be described further except as they relate to the code detect or transmit control.

Data is applied to the data register 214 and to the code detect 248. A register 709 in the code detector 248 includes locations for various data. For example, the repeat count data is stored in location 710, the mask in location 711, the period count in location 712, and the instruction in location 714, the preamble in location 716 and the repeat pattern in location 718. A comparator 720 is searching all the time for the Preamble. When the comparator 720 sees the preamble at position 716, it knows that just to the right of it, i.e. position 718, is the repeated pattern and to the left, i.e. position 714, is the instruction. The rest of the data in the register 709 relates to a period count in position 712, a mask in position 711, with the repeat count to its left in position 710.

When the logic related to the comparator 720 compares the preamble from position 716 with the preamble pattern 724, the instruction is decoded and its execution commences. Register 709 is coordinated in time with the data register 214 to insure synchronization with the information stored in the data register.

When the comparator 720 compares the preamble, it enables the AND gate 722 to put the contents of the instruction in position 714 into the instruction decode 723. If, for example, the instruction decode 723 sees that it is a repetition, it enables the AND gate 728 so that the repeat count from position 710 is put into the repeat counter 238 and the period count from position 712 is put into the address lines of the mask register 780 and the pattern register 781. As illustrated in FIG. 7, to regenerate the original data, the code detect loads the mask bits into a variable length end around shift mask register 780. It also loads the repeat pattern bits into a variable length end around shift pattern register 781. An example of a variable length shift register is a Motorola IC chip #MC14557B. The shift registers are sized for the pattern and mask involved by the period count bits being connected to the MC14557B shift register address leads.

The data bit stream is received in the data register 214. When there is no data regeneration to be done, the repeat counter 238 is reset to all zeros and the data is transferred out of the data register 214 at normal speed via the transmit control 244 enabled by AND gate 783, inverter 785 and OR gate 793, AND gate 786, and OR gate 796.

When AND gate 783 output is true, as previously described in connection with the instruction decode, repetitive bits are to be reinserted into the output via the transmit control 244. The mask register 780 and pattern register 781 shift end around at the data output speed inserting a bit from the pattern register 781 when the mask register 780 output is a "one" using AND gate 787 and OR gate 796. A data register output bit from data register 214 is inserted into the output via the transmit control 244 controlled by a zero in the mask register 780 using inverter 784, AND gate 788, OR gate 793, AND gate 786, and OR gate 796.

FIG. 8

The basis for data compression is to remove the repeated bits because they need not be stored, but rather regenerated at a later time.

FIG. 8a shows five 4-bit characters where the first bit of each character is a one, and the third bit of each character is a zero. This example of the invention removes the 1st and 3rd bits of each character and sends the remaining bits, in this case as 2 bit characters. To designate which bits to remove (and later regenerate), the control data contains a mask which has the 51st and 3rd bits set to one (remove) and the remaining bits reset to zeros (retain). The first 4 bit character of the data involved in repetition is transmitted as the pattern, such as pattern 457 in FIG. 4. The pattern shows the state (1's or 0's) of the repeated bits for later use when regenerating the data.

Figures 8C, 8D:
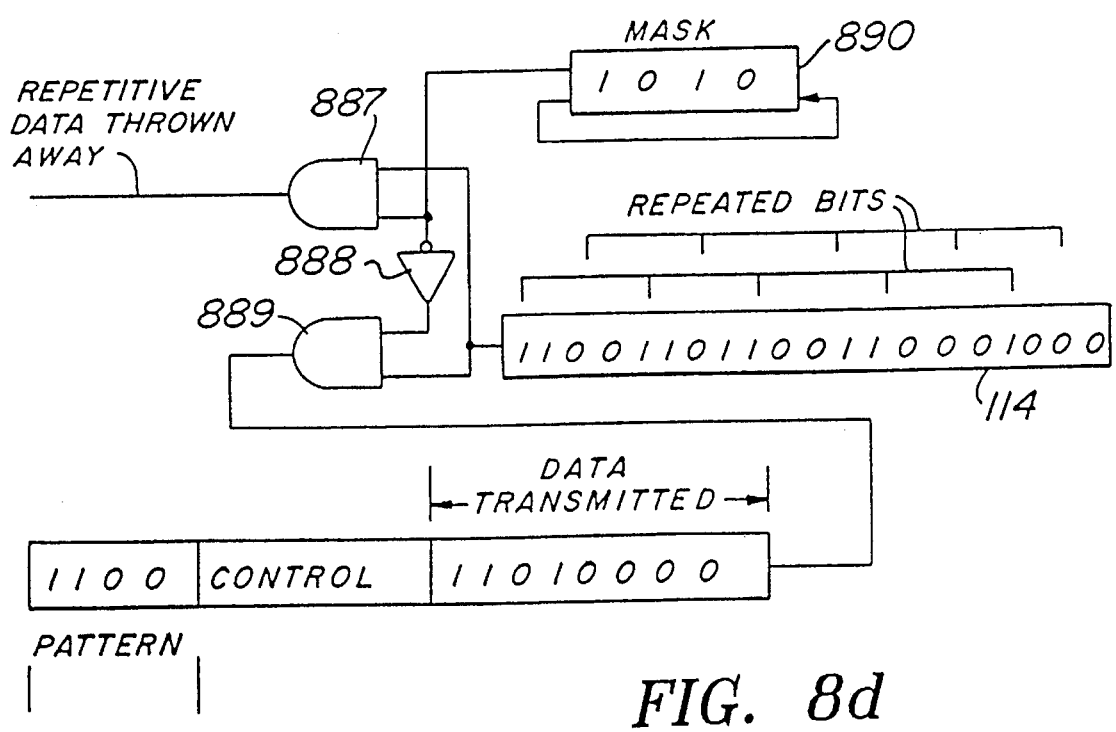

FIG. 8b shows a similar case using a CVSD coded audio frequency as an example. FIG. 8c shows a similar case using ASCII coded data. FIG. 8d shows the technique of removing the repeated bits before storage or transmission using the data of FIG. 8a. The mask bits are in an end around mask shift register 890 moving at the same clock rate as the shifting in data register 114. The mask register bits cause the data register bits to be either thrown away via AND gate 887 or to be stored or transmitted via AND gate 889.

FIG. 9

The description of FIG. 9 will be subdivided into sections for purposes of explanation.

Write Data In

Referring to FIG. 9, the compress data circuit 119 includes the data memory 953 for receiving data from the same source as the data register 114. One or more Motorola 64K×1 bit chip(s) #MCM6664A may be used for this memory. A write address 970 counts upward initially from zero and controls storing each incoming bit sequentially in the data memory 950.

Read Data Out

The read address circuit 972 counts upwardly, initially from zero, sequentially and controls reading each bit that was stored by the write address 970. This passes data through this system unaltered except for some time delay. The read address 972 is prevented from reading from memory 950 until the write address contents is a magnitude of 256 higher than the read address circuit 972 contents as controlled via OR gate 969, AND gate 967, compare circuit 971 and minus circuit 956, which subtracts 256 from the write address circuit 970 contents.

Read and Write Difference

The difference between the read address and the write address is maintained in order to insure that the start of repetition has not already exited via FIFO 118 when a repetitive sequence is detected. This difference quantity must be at least as large as the highest period size (n) times the bit counter detect value (63 in the embodiment described) plus whatever safety factor and logic set up delay time is required. The write address and read address are modulo counters which revert to zero when they reach their maximum count. This causes the memory to appear to be a delay line with all the bits accessible.

Multiple Repeat Detects

A select period 980 performs a means of selecting the optimum period n when more than one repeat detect circuit 127 becomes active simultaneously. Motorola priority encoder MC14532B and Motorola line decoder MC14514B may be used to implement select period 980.

A separate circuit corresponding to the one illustrated in FIG. 5 is used for each different period size to be examined. Select period 980 receives a start lead 568 from each repeat detect circuit 127 which indicates that one of the repeat detect circuits 127 bit counters, for example 510, 511, 512, 513, has reached a count of 63. Select period 980 selects the repeat detect circuit 127 which is determined by system parameters to be optimum, enables the appropriate select period lead 982 and does not accept any more start leads 568 from other repeat detect circuits until data compression is complete. When the repeat encoding and compressing is finished, the select period 980 is reset to allow a new repeat detect 127 cycle to start.

Find Repetition

The following illustrates the preparation of the compress data 119 logic to perform its function of reducing the number of bits to be sent or stored. When repetition was found and a particular repeat detect 127 (FIG. 5) was enabled by the period select 980, an offset counter 974 was loaded by way of lead 931 and tri-state drivers 537 with the sequencer circuit 506 contents. The mask shifter 935 was loaded from flip flops 520, 521, 522 and 523 via tri-state drivers 590, 591, 592 and 593 under control of AND gate 566 combining the true lead 982 and down count 529 at zero.

The mask shifter 935 bits must be lined up with the bit counter 510, 511, 512 or 513 logic which first detected the repetition sequence. To do this, the offset counter 974 counts down causing the mask shifter 935 to shift left with each count until the offset counter 974 reaches zero. If the offset counter 974 was loaded with zero, because bit counter 510 was the first to detect 63 repetitive bits, the mask shifter 935 bits will not alter their starting position.

Record Beginning

The address of the beginning of the repetitive bits is recorded by the lead 929 from period select 980 causing the write address 970 contents minus the accumulated repeated block size to be loaded into the begin repetition register 940 by way of AND gate 939 with inverter 942 output being true and subtract 947, which subtracts the product of lead 932 and 933 obtained from multiplier 955.

It is recognized that the multiplier 955 can be eliminated by the proper placement of the binary bits into the subtractor 947 if all of the period sizes (n) or all of the bit counters in the system are an exact power of 2.

Transfer Control of Read Address

Lead 929 transfers control of read address 972 from compare 971 via inverter 943, AND gate 967 and OR gate 969 to compare 945 via OR gate 969 AND gate 968. This causes data reading from data memory 950 to continue until it reaches the beginning of the detected repetition. When read address 972 is equal to the contents of begin repetition 940, read address is halted by the compare 945 via AND gate 968 and OR gate 969. The leading edge of compare 945 signal starts code insert 126 enable 682 via AND gate 968 and lead 928 to start loading the control data into FIFO 118 as described under FIG. 6.

All data containing repetitive bits is held in the data memory until the block size is known and can be inserted into the control data format as the repeat count 466 (FIG. 4). The repetitive bits are then removed as the data is output via the output FIFO 118. If the system application uses a separate control channel or separate memory locations instead of imbedding a preamble and control within the data, the data can be reduced before the full repeat count is known. However, this will add complexity to keep track of the data pointers for the data memory and, therefore, not included in this description.

End Repetition

When the end of repetition occurs as evidenced on lead 934 from FIG. 5, the repeat count 466 is processed and the end of repetition address is recorded as follows. The total size of the data involved in terms of bits,is loaded into the repeat register 606 via AND gate 608 from subtract circuit 946. Subtract circuit 946 subtracts the start repetition address in the begin repetition circuit 940 from the write address 970 contents. At the same time, lead 934 loads the write address contents into end repetition register 938 by way of AND gate 941.

Code insert 126 (FIG. 6), in conjunction with compress data 119, finishes inserting control data format as follows. Lead 934 instructs sequence counter 688 at the following clock time via delay 649 to resume its count from 47+n in order to complete entering the control data by sending the repeat register contents to output FIFO 118.

Compress Data

When the repeat count 466 (FIG. 4) of the control data has been inserted into FIFO 118, the sequence counter 688 halts at 63+n and lead 999 enables the mask shifter 935, enables the read address 972 via OR gate 969, and transfers control of output data lead 951 from inverter 958 AND gate 957 to AND gate 954.

Data compression is done by omitting the repetitive bits as the data is read from data memory on lead 951. The mask shifter 935 shifts end around and enables bits, or does not enable bits, from lead 951 to FIFO 118 via AND gate 954 under control of inverter 948. The criterion for this control is the one-zero pattern of the mask shifter 935 contents.

The speed of operation of the mask shifter 935 and data compression may be faster than the input and output of the system. It may be as high a frequency as the data memory 950 can operate, and depends upon the ability of the input FIFO 115 and output FIFO 118 to compensate for frequency differences. Integrated circuit chips CD40105B may be used for the FIFO 118 and FIFO 115.

The mask shifter 935 shifts end around to disable AND gate 954 via inverter 948 when its output is a one, and to enable AND gate 954 when its output is a zero. Data at this time is being read from data memory 950. This, in effect, transfers bits from the data memory 950 to FIFO 118 via AND gate 954 only when mask shifter 935 is outputting a zero.

This process continues as long as the read address 972 contents is not equal to end repetition 938 contents. Compare circuit 949 resets all system logic except read address 972, write address 970 and data register 114 when the read address counts upward to the value contained in the end repetition 938 register. A new search for repetition begins.

Time and memory space protect is implemented by OR gate 960 which combines two system safety factors to force the end of data blocks to be compressed. One input is from watchdog circuit 961 which has its timing set depending on system parameters. OR gate 960 is also activated by comparator 962 which compares read address 972 contents with write address 970 contents by way of safety circuit 963. Safety circuit 963 subtracts a factor from the write address 970 contents as required by individual system design to provide sufficient storage recovery time and space between data blocks to be compressed.

FIG. 10

The invention described herein may be made to be tolerant of bit errors or deviation from exact repetition after a selected number of successfully repeated bit patterns. The criteria of deviation from the repeated pattern is set depending on (1) the type of data being processed, for example, CVSD where a few bit transpositions in a long string of repeated patterns is not perceptible in the final outcome or of the perception of performances, or (2) depending on the incentive to compress data, for example, all circuits busy in a TASI system.

FIG. 10 illustrates one embodiment of a logic circuit which may be used to implement repetition tolerance. When used, FIG. 10 is placed between the connections of OR gate 524 and tri-state driver 525 (FIG. 5) using lead 1020 and lead 1021, respectively, and connecting lead 1008 to sequencer 506.

FIG. 10 monitors the number of data bit errors reflected by OR gate 524 (FIG. 5) and controls the signals into tri-state driver 525 to allow some false outputs of FIG. 5 comparator 501 to be ignored. The number of false outputs is compared to a number set in the threshold 1001 as the number of bit errors tolerated per period (n) by its associated repeat detect 127 (FIG. 5).

False counter 1007 counts upward by one each time lead 1020 becomes active. The false counter 1007 is counted down by the number set in the threshold 1001 each time the repeat detect 127 FIG. 5 sequencer 506 is cycled; implemented by lead 1008. In this way FIG. 10 insures that compress data 119, FIG. 9, and code insert 126, FIG. 6, is not activated unless the false comparisons of the repeat detect 127 exceed the number set in threshold 1001.

At the start of operation all FIG. 10 counters 1002 are reset. As described earlier in FIG. 6, only one FIG. 5 can be activated at once. Nothing happens to the circuit of FIG. 10 until a circuit corresponding to FIG. 5 (which had its select period 982 lead selected by FIG. 6) has an output on lead 1020. If the threshold 1001 circuit is set at zero (which means the system will tolerate no errors) lead 1020 is passed on to FIG. 6 via AND gate 1013 under control of compare 1011 threshold 1001 and false counter 1007.

If, for example, the threshold 1001 is set to two and there is one bit of the repeat mask which is not repeated as indicated by one pulse on lead 1020, the false counter 1007 will be counted upward to one (1). At the end of the activated FIG. 5 sequence count, lead 1008 will cause counter 1002 to send 2 pulses to AND gate 1010. The counter 1002 is set with the same number as the number set in threshold 1001. The first of the two pulses to AND gate 1010 causes false counter 1007 to count down to zero. This turns off AND gate 1010 preventing false counter 1007 from going below zero. During this sequence the compare 1011 did not find threshold 1001 and false counter 1007 to be alike and therefore no further action occurred.

If, for example, the threshold 1001 is set to two and there are 2 or more bits of the repeat mask which are not repeated as indicated by pulses on lead 1020, the following will occur. The first two pulses count the false counter 1007 to two which is the same as the number in threshold 1001 causing the output of compare 1011 to be true. AND gate 1013 is enabled from the 2nd pulse on lead 1020 and comparator 1011. This enables AND gate 1013 to forward a true on lead 1021 FIG. 6 via tri-state driver 525.

This is an example of one repetition tolerance scheme. A FIG.10, which is repetition tolerance 122 (FIG. 1), can be used for a specific individual bit within a FIG. 5, which is repeat detect 127 (FIG. 1), by connecting lead 1020 and lead 1021 in series with an input lead of OR gate 524 rather than the output lead of OR gate 524. It is understood that there are more complex voting schemes to determine the criteria of repetition tolerance such as totalling different numbers of up counts and down counts. These are not shown here for simplicity of explanation and because they are known to those skilled in the art.

Another application where the repetition tolerance criteria may be compromised is the least significant bit or bits of voice encoded 8 bit PCM characters. This may be particularly attractive in a TASI system when all trunks are busy and some sacrifice of quality is acceptable in preference to a break in service.

The implementation of this PCM compromise is to synchronize the PCM character with the sequencer of an "N equals 8" FIG. 5. Then force true conditions to the appropriate bit counter logic and mask register flip flop which is associated with the least significant PCM bit(s). For instance, if bit counter 513 was associated with the PCM least significant bit, at appropriate times, AND gate 516 is forced true AND gate 517 is forced false. This causes the least significant bit to be treated as if it is repeated. In large repetition systems designed for PCM data handling where FIG. 5s are included for n=16, n=24, n=32, n=40, n=48, etc., every 8th bit (LSB) in the FIG. 5 is treated as bit counter 513 logic described above.

As mentioned previously at the beginning of the descriptions relating to FIGS. 1 and 2, the subject application is similar in many respects to applicant's previous U.S. Pat. Nos. 4,280,192 and 4,412,306 which applicant incorporates by reference. Some of the similarities between the subject application and U.S. Pat. No. 4,280,192 (hereinafter referred to as '192) relate to the generating of preamble, period count, instruction, and count signals. These signals are discussed in the '192 patent in a number of places, some of which as are specifically mentioned herein.

With respect to the preamble signal and period count signal, paragraphs in Column 3, lines 34–50 of the '192 patent include the following:

"A code insert, operated by the timer, applies a preamble and appropriate code(s) to the appropriate position in the data register. Details of the code insert will be described in connection with FIG. 6. It is common practice when inserting codes within a data stream to have a predetermined bit pattern inserted prior to the code in order to differentiate and separate subsequent codes from the data. Many types of preambles are used today depending on the type of data being passed and the required code detect reliability. An excellent example of this is the ASCII control code . . . Another example . . . Bell Systems T carrier as described in the Bell System Technical Journal, October, 1972, Pages 1704–1708."

Also, with respect to the preamble, it is stated in Column 5, lines 16–22 of the '192 patent as follows:

"A preamble is next sent and may comprise for example 32 ones, 2 zeros and two ones. The preamble format is not claimed as being unique and may be a different bit configuration. The preamble purpose is to alert the data recovery logic to special instructions to be followed in order to reproduce repetitive data, insert background data, etc."

With respect to the instruction signal, the '192 patent states in Column 8, lines 31–42 as follows:

"The instruction generator has mandatory four bits each of which is the part of the preamble and fixed at 0011 when it starts putting an instruction into the AND gate. The subsequent four bits (after 0011) are dependent upon the operating conditions of the system of FIG. 1 whether or not there is a repetition sample, background sample, etc. There will be a specific code for these four bits. For instance, 0001 might be selected in indicate a repetitious pattern. After the preamble, the instruction is transmitted from the instruction generator to the AND gate during the 32 through 39 counts enabled by the decode."

With respect to the repeat count signal, the '192 patent states in Column 9, lines 1–12 as follows:

"The repeat counter contents is inserted into the control word format. This is the last section of the control word format (FIG. 3) and requires the sequence counter to go from 48 to 63 and the repeat register contents goes into the data register. The sequence counter continues counting again from 48 through 63 enabling the AND gate 104 to permit data from the repeat register to pass bit by bit through the OR gate 96 and through the insert select to the data register. When the decode has reached 63, the entire code word format has been stored and the enable flip flop is reset."

The same '192 patent discusses the interaction with repeat counter, period register, repeat pattern, and instructions in Column 4, line 63, to Column 5, line 3 as follows:

"The repeat counter continues to count the total bits being repeated and the period register continues to hold the size of the repeated pattern as long as the frequency detect continues at the same pulse rate . . . . It is now acceptable to send instructions".

I claim:

1. An apparatus for suppressing storage or transmission of repetitive bits of a digital input signal received from a signal source, said apparatus comprising:

(a) monitoring means for monitoring said digital input signal for a plurality of groupings of bits of said digital input signal, each grouping comprising plural groups of N bits per group;

(b) comparing means for comparing at least one bit of one of said groups with a respective bit of the others of said plural groups of said grouping to count the number of times said bits compared repeat in order to establish a particular grouping; and (c) signalling means for generating an identification signal for identifying those bits in said plural groups in said particular grouping that have repeated said number of times and those bits in said plural groups in said particular grouping that have not repeated said number of times.

2. The apparatus of claim 1 additionally comprising means for providing a compressed digital data signal which does not include said bits compared that have repeated.

3. The apparatus of claim 2 additionally comprising converting means for converting said compressed digital data signal to a signal replicating said digital input signal.

4. The apparatus of claim 2 wherein said identification signal comprises a digital masking signal of the same number of bits per group of said particular grouping.

5. The apparatus of claim 4 further comprising compressing means for associating each of said bits of said digital masking signal to the respective bits of each one of said groups to create a compressed digital data signal, whereupon said compressed digital data signal does not include said bits compared that have repeated consecutively said number of times.

6. The apparatus of claim 5 further comprising code generating means for generating a coded digital signal comprising said compressed digital data signal, said masking signal, one of said plural groups, a digital signal representing the same number of bits per group, and a digital signal representing the total number of bits in said particular grouping.

7. The apparatus of claim 6 wherein said monitoring means comprises a first storage means for receiving said digital input signal.

8. The apparatus of claim 6 further comprising converting means for converting said coded digital signal to said digital input signal by restoring said bits compared which have repeated consecutively to said compressed data signal.

9. The apparatus of claim 8 wherein said converting means further comprises code detecting means for decoding said coded digital signal utilizing said compressed digital data signal, said masking signal, said one of said plural groups, said digital signal representing the same number of bits per group, and said digital signal representing the total number of bits in said particular grouping.

10. The apparatus of claim 9 wherein said converting means further comprises a transmit control means for outputting a digital output signal replicating said digital input signal, by restoring said bits compared of the groups which have repeated consecutively to said compressed digital data signal, said transmit control means being controlled by said code detecting means.

11. The apparatus of claim 1 wherein said number of times is predetermined.

12. The apparatus of claim 1 wherein said comparing means further comprises tolerance means permitting said count to continue despite a predetermined number of non-repetitious comparisons of said bits compared.

13. The apparatus of claim 1 wherein the number of bits per group in any grouping is different from the number of bits per group in the others of said groupings.

14. The apparatus of claim 13 wherein said apparatus additionally comprises means for selecting one of said groupings.

15. The apparatus of claim 14 wherein said selecting means selects the grouping having the greatest number of respective bit repetitions.

16. The apparatus of claim 2 wherein said number of times is predetermined.

17. The apparatus of claim 2 wherein said comparing means further comprises tolerance means permitting said count to continue despite a predetermined number of non-repetitious comparisons of said bits compared.

18. The apparatus of claim 2 wherein the number of bits per group in any grouping is different from the number of bits per group in the others of said groupings.

19. The apparatus of claim 18 wherein said apparatus additionally comprises means for selecting one of said groupings.

20. The apparatus of claim 19 wherein said selecting means selects the grouping having the greatest number of respective bit repetitions.

21. The apparatus of claim 7 wherein said number of times is predetermined.

22. The apparatus of claim 7 wherein said comparing means further comprises tolerance means permitting said count to continue despite a predetermined number of non-repetitious comparisons of said bits compared.

23. The apparatus of claim 7 wherein the number of bits per group in any grouping is different from the number of bits per group in the others of said groupings.

24. The apparatus of claim 23 wherein said apparatus additionally comprises means for selecting one of said groupings.

25. The apparatus of claim 24 wherein said selecting means selects the grouping having the greatest number of respective bit repetitions.

26. The apparatus of claim 3 wherein said number of times is predetermined.

27. The apparatus of claim 3 wherein said comparing means further comprises tolerance means permitting said count to continue despite a predetermined number of non-repetitious comparisons of said bits compared.

28. The apparatus of claim 3 wherein the number of bits per group in any grouping is different from the number of bits per group in the others of said groupings.

29. The apparatus of claim 28 wherein said apparatus additionally comprises means for selecting one of said groupings.

30. The apparatus of claim 29 wherein said selecting means selects the grouping having the greatest number of respective bit repetitions.

31. The apparatus of claim 1 wherein said comparing means initiates a new count whenever said bits compared do not repeat consecutively within said grouping.

32. The apparatus of claim 2 wherein said comparing means initiates a new count whenever said bits compared do not repeat consecutively within said grouping.

33. The apparatus of claim 3 wherein said comparing means initiates a new count whenever said bits compared do not repeat consecutively within said grouping.

34. The apparatus of claim 6 wherein said compressing means further comprises a storage means for receiving and storing said digital input signal, said storage means assigning memory addresses to said bits of said digital input signal stored therein.

35. A device for suppressing the storage or transmission of repetitive bits of a digital input signal from a signal source, said device comprising:
(a) storing and monitoring means for monitoring said digital input signal to detect repetition in bits of plural groups of bits in order to establish at least one grouping of bits of said digital input signal, said at least one grouping of bits comprising said plural groups of N bits per group, said storing and monitoring means detecting repetition in a number of subgroups of repetitive bits in said at least one grouping of bits, wherein a subgroup is defined as comprising N bits or less within said groups to produce said at least one grouping of bits; and
(b) means responsive to said at least one grouping of bits for generating a signal for identifying said subgroups of repetitive bits of said digital input signal in said least one grouping of bits.

36. The device of claim 35 further comprising a second means for storing, and means responsive to said grouping of bits to insert in said second means for storing one of said plural groups which includes all the bits in one of said groups of said at least one grouping of bits.

37. (Amended) The device of claim 35 or 36 further comprising means responsive to said at least one grouping of bits for generating a digital signal representing the number N comprising the total number of said bits of said digital input signal in each of said groups of said at least one grouping of bits.

38. The device of claim 37 further comprising means responsive to said identifying signal for transferring data signals not identified as said subgroups of repetitive bits of said digital input signal into said second means for storing and for inhibiting transfer of said subgroups of repetitive bits of said digital input signal into said second means for storing.

39. The device of claim 38 further comprising means for counting the number of bits of said groups of signals in said at least one grouping of bits to produce a digital signal representing the total number of bits in said at least one grouping.

40. The device of claim 39 further comprising means for generating a coded digital signal comprising said one of said plural groups, said digital signal representing the number N, said signal for identifying said subgroups of repetitive bits of said digital input signal, said digital signal representing the total number of bits in said at least one grouping and said data signals not identified as said subgroups of repetitive bits of said digital input signal, whereby compressed digital data signals are produced.

41. The device of claim 40 further comprising means responsive to said at least one grouping of bits to identify and separate said compressed digital data signals from said digital input signal from said signal source unaffected by said at least one grouping of bits.

42. The device of claim 41 further comprising means for receiving said compressed digital data signals including said one of said plural groups, said digital signal representing the number N, said signal for identifying said subgroups of repetitive bits of said digital input signal, said digital signal representing the total number of bits in said at least one grouping and said data signals not identified as said subgroups of repetitive bits of said digital input signal, all received from said second means for storing, to regenerate said digital input signal from said signal source in their original form.

43. The apparatus of claim 35 wherein said number of subgroups to produce said at least one grouping of bits is predetermined.

44. The apparatus of claim 35 wherein said storing and monitoring means further comprises tolerance means permitting said detecting repetition to continue despite a predetermined number of non-repetitious detection of said bits compared.

45. The apparatus of claim 35 wherein the number of bits per group in any one of said at least one grouping is different from the number of bits per group in the others of said at last one groupings.

46. The apparatus of claim 45 wherein said apparatus additionally comprises means for selecting one of said at least one groupings.

47. The apparatus of claim 46 wherein said selecting means selects the grouping having the greatest number of respective bit repetitions.

48. The apparatus of claim 42 wherein said number of subgroups to said produce said at least one grouping of bits is predetermined.

49. The apparatus of claim 42 wherein said storing and monitoring means further comprises tolerance means permitting said detecting repetition to continue despite a predetermined number of non-repetitious detection of said bits compared.

50. The apparatus of claim 42 wherein the number of bits per group in any one of said at least one grouping is different from the number of bits per group in the others of said at least one groupings.

51. The apparatus of claim 50 wherein said apparatus additionally comprises means for selecting one of said at least one groupings.

52. The apparatus of claim 51 wherein said selecting means selects the grouping having the greatest number of respective bit repetitions.

53. In a digital storage or transmission system, a source for generating a signal, a plurality of comparing means for comparing respective bits in groups of bits corresponding to the signal in order to determine a number of repetitions of one or more respective bits of said groups, means responsive to said comparing means for generating identification signals representative of each of said bits of said groups at which said number of repetitions has been detected and suppression means for utilizing said identification signals to suppress transmission of the repetitive bits of said groups for minimizing the amount of bits transmitted.

54. The system of claim 53 wherein said comparing means includes tolerance means to determine when said number of repetitions of bits in each of said groups permits including in said number of repetitive bits, non-repetitive bits.

55. The system of claim 53 wherein said number of repetitions of bits in each of said groups is predetermined.

56. The system of claim 53 wherein said comparing means further comprises tolerance means permitting said determination of said number of repetitions of bits in each of said groups to continue despite a number of non-repetitious comparisons of said bits compared.

57. The system of claim 53 wherein the number of bits per group in any said groups of bits is different from the number of bits per group in the others of said groups of bits.

58. The system of claim 57 wherein said apparatus additionally comprises means for selecting one of said groups of bits.

59. The system of claim 58 wherein said selecting means selects said groups of bits having the greatest number of respective bit repetitions.

60. In a digital transmission system, a source for generating a signal, a plurality of examining means for examining respective bits in groups of bits corresponding to the signal in order to determine a number of repetitions of bits of one or more respective bits of said groups, means responsive to said examining means for generating identification signals representative of each of said bits of said groups at which said number of repetitions has been detected and suppression means for utilizing said identification signals to suppress transmission of the repetitive bits of said groups for minimizing the amount of bits transmitted.

61. The system of claim 60 wherein each of said means for examining said bits assembles said bits in different numbers of bits per group to detect the greatest number of said bit repetitions to select and use the optimum group resulting from said detection to minimize the amount of bits transmitted.

62. The system of claim 60 wherein said number of repetitions of bits in consecutive groups of bits is predetermined.

63. The system of claim 60 wherein said examining means further comprises tolerance means permitting said number of repetitions to be continued to be counted despite a number of non-repetitious comparisons of said bits compared.

64. The system of claim 60 wherein the number of bits per group in any of said groups at which said number of repetitions has been detected is different from the number of bits per group in the others of said groups at which said number of repetitions has been detected.

65. The system of claim 64 wherein said apparatus additionally comprises means for selecting one of said groups at which said number of repetitions has been detected.

66. The system of claim 65 wherein said selecting means selects said groups at which said number of repetitions has been detected having the greatest number of respective bit repetitions.

67. An apparatus for suppressing repetitive bit signals of a digital input signal from a signal source, wherein said apparatus is to be used in a system for storage or transmission of the digital input signal, said apparatus comprising:

(a) means for storing bit signals of said digital input signal from said source;

(b) one or more comparing means for detecting repetition in at least one of the respective bit signals in a plurality of plural groups of said bit signals to produce a grouping of bit signals; and (c) means responsive to said comparing means for generating a signal for identifying individual repetitive bit signals in said grouping of bit signals.

68. The apparatus as set forth in claim 67, wherein one or more of said comparing means includes one or more comparator circuits for comparing said respective bit signals and for generating said signal for identifying individual repetitive bit signals in said grouping of bit signals.

69. The apparatus as set forth in claim 67 wherein a repetition tolerance circuit is coupled to said comparing means, said repetition tolerance circuit generating a threshold level to control the number of bit signals in said respective bit signals that must be repetitive before said grouping of bit signals is produced.

70. The apparatus of claim 67 wherein the number of repetitions to produce a grouping of bit signals is predetermined.

71. The apparatus of claim 67 wherein said comparing means further comprises tolerance means permitting repetition detection within said grouping to continue despite a predetermined number of non-repetitious detection of said bit signals compared.

72. The apparatus of claim 67 wherein the number of bit signals per group in any one of said plurality of plural groups is different from the number of bit signals per group in the others of said plurality of plural groups.

73. The apparatus of claim 72 wherein said apparatus additionally comprises means for selecting one of said one of said plurality of plural groups.

74. The apparatus of claim 73 wherein said selecting means selects the one of said plurality of plural groups having the greatest number of respective bit signal repetitions.

* * * * *